United States Patent [19]

Patterson

[11] Patent Number: 4,967,152
[45] Date of Patent: Oct. 30, 1990

[54] APPARATUS INCLUDING A FOCUSED UV LIGHT SOURCE FOR NON-CONTACT MEASUREMENT AND ALTERATION OF ELECTRICAL PROPERTIES OF CONDUCTORS

[75] Inventor: Joseph M. Patterson, Mission Viejo, Calif.

[73] Assignee: Ultra-Probe, Laguna Hills, Calif.

[21] Appl. No.: 261,687

[22] Filed: Oct. 24, 1988

Related U.S. Application Data

[60] Division of Ser. No. 166,978, Mar. 11, 1988, which is a continuation of Ser. No. 914,719, Oct. 3, 1986.

[51] Int. Cl.$^5$ ...................... G01R 19/00; G01R 31/00
[52] U.S. Cl. .................................. 324/158 R; 324/96; 356/369; 156/643
[58] Field of Search ................... 324/158 R, 73 R, 96, 324/71.3; 356/365, 367, 369; 156/601, 646, 643, 626, 627

[56] References Cited

U.S. PATENT DOCUMENTS

| 3,880,524 | 4/1975 | Dill et al. ............................ 356/369 |
| 3,985,447 | 10/1976 | Aspnes ............................... 356/369 |
| 4,355,278 | 10/1982 | Burns et al. ............................ 324/96 |
| 4,394,237 | 7/1983 | Donnelly et al. .................... 156/643 |
| 4,637,726 | 1/1987 | Walker et al. ....................... 356/367 |
| 4,653,924 | 3/1987 | Itonaga et al. ....................... 356/369 |
| 4,668,337 | 5/1987 | Sekine et al. ........................ 156/646 |
| 4,681,449 | 7/1987 | Bloom et al. ....................... 356/365 |
| 4,695,162 | 9/1987 | Itonaga et al. ....................... 356/369 |
| 4,698,587 | 10/1987 | Burns et al. ..................... 324/158 R |
| 4,703,260 | 10/1987 | Beha et al. ....................... 324/158 R |

OTHER PUBLICATIONS

"Signal Level Regulation and Dark Current Compensation for Wavelength-Scanning Ellipsometer", by Hanes et al, IBM Tech. Disc. Bull., vol. 21, #2, 7/78, pp. 855-856.
"A Method of Detecting Hot Spots on Semiconductor Using Liquid Crystals", by Hiatt, Reliability Physics, 19th Annual Proc., 4/81, pp. 130-133.
"Simple Technique for Very Thin SiO$_2$ Film Thickness Measurements", by Pliskin et al, Applied Phys. Lett., vol. 11, No. 8, pp. 257-259, 10/67.

Primary Examiner—Reinhard J. Eisenzopf
Assistant Examiner—W. Burns
Attorney, Agent, or Firm—G. Donald Weber, Jr.

[57] ABSTRACT

An apparatus which is used for non-contact electrical measurement and physical alteration of certain characteristics and properties of electronic conductor devices. The apparatus includes a focused source of ultraviolet light which is capable of micron and sub-micron resolution.

In the measurement mode the apparatus measures the energy of electrons ejected from a measurement site by the UV beam. This measurement is accomplished at a nulling/repelling device. In the alteration mode, the focused UV light beam interacts with various compounds, for example chemical gases, to create a selective reaction at specific locations at the surface of the device being operated upon.

The measurement function can be related to voltage, current, temperature or the like and may be either qualitative or quantitative while being made in a non-contact basis.

22 Claims, 5 Drawing Sheets

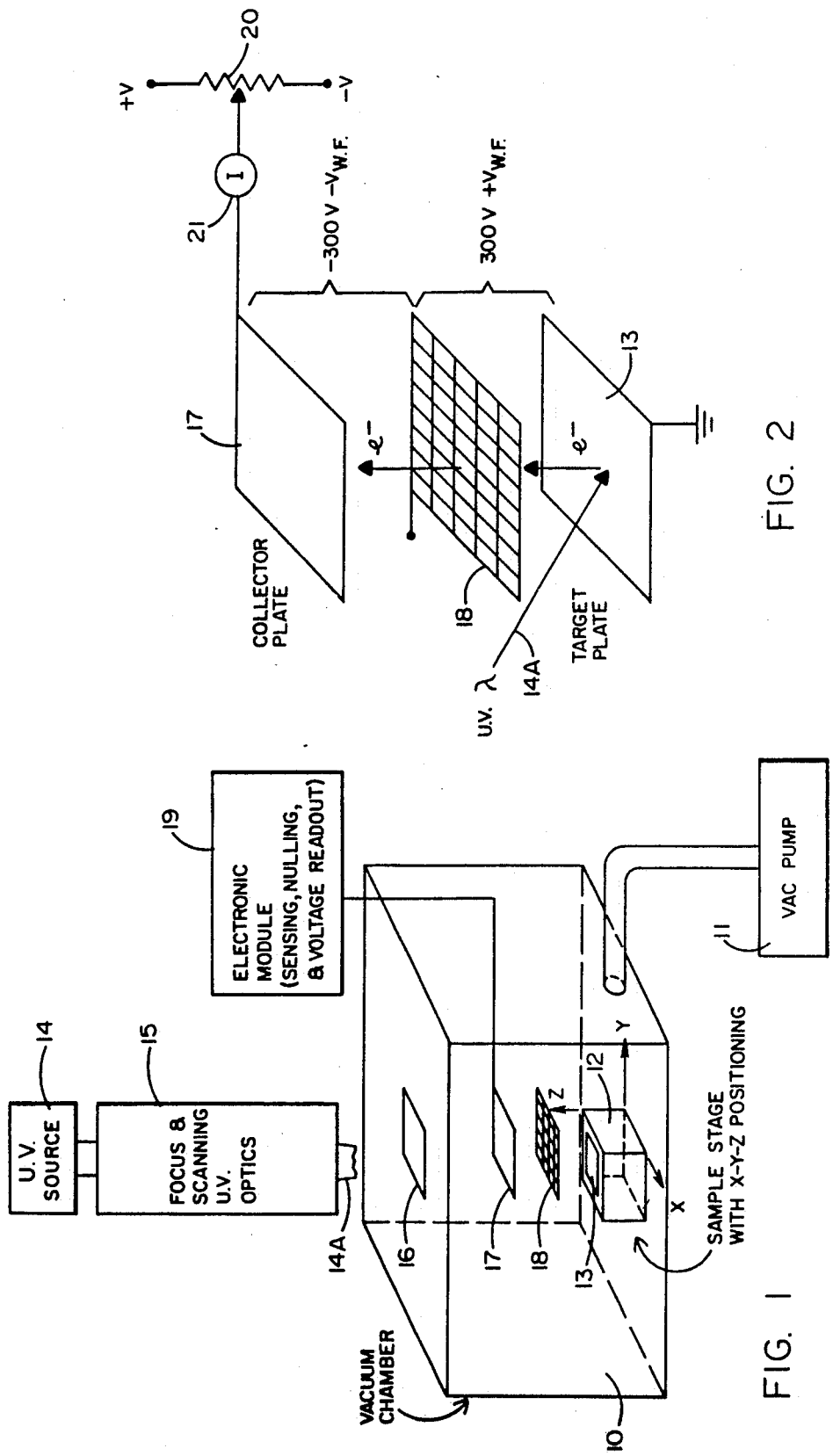

APPARATUS INCLUDING A FOCUSED UV LIGHT SOURCE FOR NON-CONTACT MEASUREMENT AND ALTERATION OF ELECTRICAL PROPERTIES OF CONDUCTORS

This is a division of application Ser. No. 166,978, filed Mar. 11, 1988 which is a continuation of application Ser. No. 914,719 filed Oct. 2, 1986.

BACKGROUND

1. Field of the Invention

This invention is directed to an apparatus for use in the measurement of electronic devices, in general, and to an apparatus which, more particularly, uses a focused, ultraviolet (UV) light beam to provide a non-contact basis for affecting measurement and/or material modification techniques.

2. Prior Art

There are various processes which are used for fabricating electronic circuits including semiconductor devices, printed circuit boards or the like. In addition, there are many steps in these processes which require constant testing and/or monitoring. Moreover, there are many instances where testing is required of the ultimate device, which testing cannot be made during the processing steps. This is especially the situation in regard to semiconductor devices. Likewise, there are times when the product, notably relative to a semiconductor device, is sufficiently complex and/or dense so that it is impossible to make internal probes or tests which are not destructive of the device.

In the past it has frequently been the case that a scanning electron microscope (SEM) has been used in conjunction with these testing procedures. In particular, the SEM is used for examination of process steps, somewhat analagous to a high powered microscope. The SEM is used mostly for examining the devices for thinning of metal over oxide steps (in semiconductor components). However, the SEM is used virtually not at all for actual electrical testing of "in-process" or even fully processed semiconductor devices. That is, the SEM is used primarily for failure analysis or examination of defects. The SEM is used to measure the variation in yield of electrons from the device in order to control image quality. This can be a function of the quantity of secondary electrons which are emitted from the surface of the device under examination. However, the cost of an SEM is quite high and, therefore, sometimes prohibitive. Moreover, the SEM is frequently not capable of making tests because the SEM has two main problems when trying to measure voltage or when performing examination on integrated circuit devices. The first is the fact that the SEM uses a beam of focused electrons that strike the sample. These electrons build up on the insulation parts of the integrated chip. This charging causes malfunctions of sensitive circuits so that a valid test cannot be made. Another effect of charging by the SEM electron beam is distortion of both the image (which is made from secondary electrons that leave the sample) and the ability to make voltage measurements.

Further, even without the undesirable charging effects, the SEM is incapable of making accurate quantative voltage measurements because the yield of secondary electrons produces a broad spectrum of energy. Attempts to measure the voltage on a conductor by detecting and "nulling" this broad spectrum of energies actually produces an average-not an actual measurement.

Other types of non-contact measurements have been developed using Auger spectroscopy techniques. In particular, this technique is established when a sample is biased to a normal operating mode and a shift in the energy of the Auger electrons is recorded. The shift in the Auger electron energy in eV is, of course, directly proportional to the potential (in volts) at the site being analyzed. This shift is known to be due to either chemical bonding or a change in the bias between the sample and the electron detector. By eliminating the chemical bonding as the cause of energy shift, it is determined that the bias on the detector or the sample has caused the shift.

As suggested above, the SEM technique includes a known phenomenon wherein the electric potential of the electron probe illuminated position is different from that of the surrounding area. In this event, the number of secondary electrons is different from that of the surrounding area and produces the voltage contrast. That is the voltage contrast in a SEM is produced by the effect of the change in the yield of secondary electrons from the site struck by the primary electron beam. Moreover, regions of the circuit that are at more negative voltages yield more electrons and appear brighter in the image. Circuit regions at more positive voltages yield fewer electrons and appear darker in the SEM image. Unfortunately, this ability to measure the voltage is degraded by the charging and by the broad range of electron energy mentioned above. Use of a stroboscopic SEM improves the operation of this apparatus somewhat but it is very expensive and difficult to accomplish.

Another technique is eletron beam probing, especially in IC (integrated circuit) testing. This technique requires the use of an SEM which has been modified to include a blanking circuit, a timing unit, an IC drive unit, a signal processing and display unit, and a secondary-electron spectrometer if the measurement is to be truly quantative. The spectrometer is required because the electron beam produces a broad, continous range of energies. In contrast, the UV source produces a predictable maximum energy of secondary electrons. In essence, electron beam probing is similar to the voltage contrast technique noted above except that the electron spectrometer is used. This technique has the same problems as the standard SEM, viz. charging of the sample and the broad range of electron energies produced by the primary electron beam.

These are several techniques which are known in the prior art. However, each of these techniques and processes has various shortcomings as noted above. Consequently, an improved measuring and detecting device and technique is desired.

SUMMARY OF THE INSTANT INVENTION

This invention is directed to a system which uses the photoelectric effect by using a stimulation source of ultraviolet light to make non-contact quantitative measurements and material adjustment processes on relatively small electrical devices such as printed circuit boards, semiconductor devices, integrated circuit chips and the like.

The system comprises three major components, namely, the ultraviolet stimulation source which can be an ultraviolet lamp, an ultraviolet laser or any other source of focused ultraviolet signals; an electron detector; and a sample chamber which is capable of being evacuated and, as well, accomodating the electron detector noted above and, perhaps, the ultraviolet source.

In addition, the system is capable of making quantitative, non-contact voltage measurements, as well as voltage potential area mapping for integrated circuits. It can also produce non-contact, current measurement and current path imaging. The system can also produce non-contact, temperature measurement and temperature mapping. As well, the system can do selective removal of oxide, nitride, metal or other layers to effect "cut and patch" operations at controlled microscopic sites. The system can do junction imaging in semiconductor devices. The system can selectively apply a conductive layer, film or strip onto a sample surface adjoining other conductors.

All of these techniques can be produced by using a focused ultraviolet light source which is capable of micron or sub-micron resolution.

BRIEF DESCRIPTION OF THE DRAWINGS

FIG. 1 is a schematic representation of one embodiment of the system which forms the instant invention.

FIG. 2 is a more detailed showing of the detector portion of the system.

DESCRIPTION OF THE PREFERRED EMBODIMENT

Figure 3:
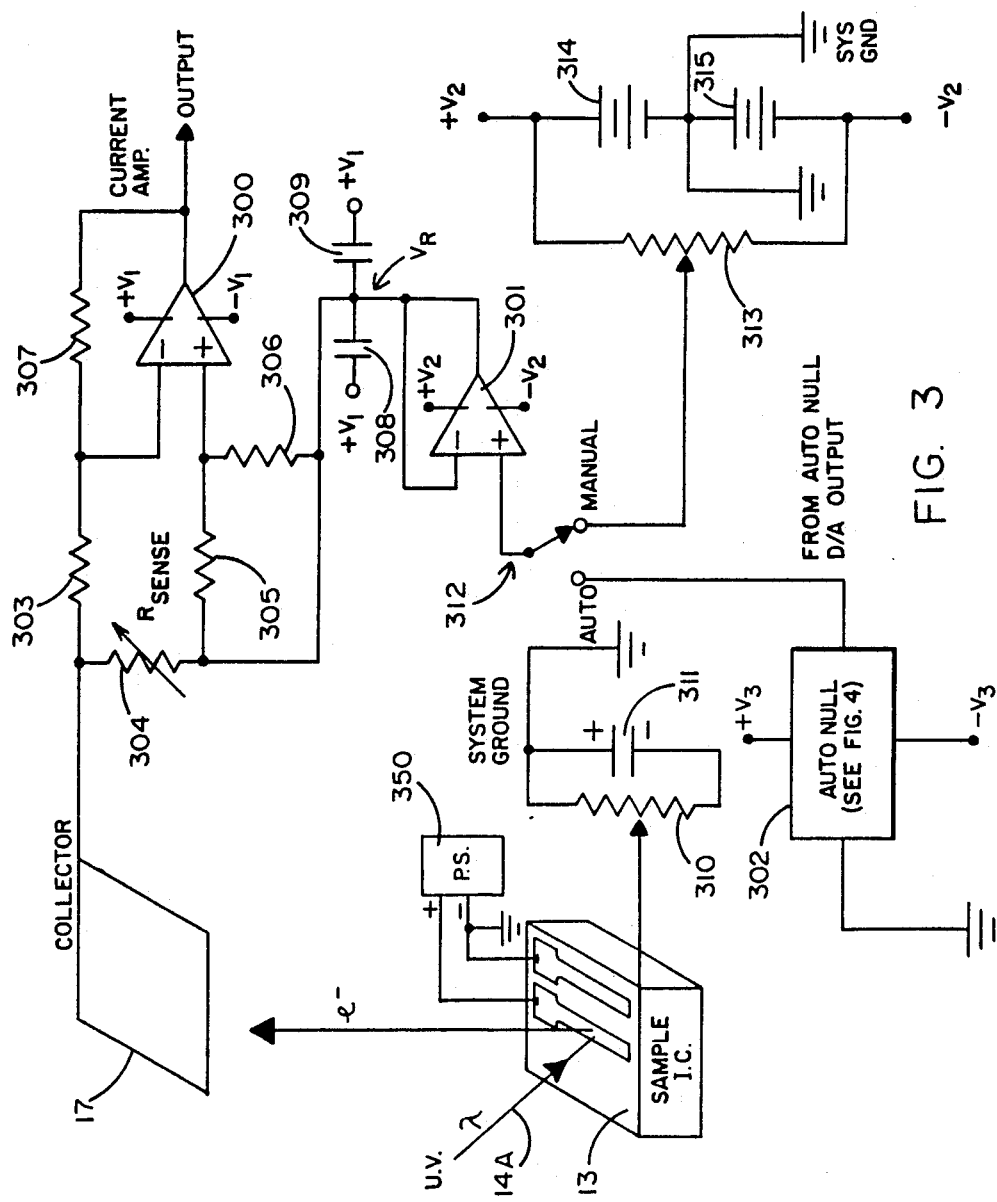
FIG. 3 is a schematic block diagram of the measuring circuit of the instant invention.

Referring now to FIG. 1, there is shown a block diagram representation of the system of the instant invention. In particular, a vacuum chamber 10 is provided wherein the specific operations of the invention occur. The vacuum pump 11 is connected to vacuum chamber 10 in a standard and suitable fashion to affect a moderate vacuum within chamber 10. A perfect vacuum is not required for the proper operation of the invention as contemplated herein. In general, a vacuum on the order of 1.0 millitorr is quite adequate.

Positioned within chamber 10 is a sample stage 12 which can be arranged to be movable, within chamber 10, in the X, Y and/or Z directions. The sample stage 12 is suitable for mounting thereon any of the samples which are to operated upon in accordance with the instant invention.

The method and means for positioning the work stage 12 within the vacuum chamber 10 is not shown in detail inasmuch as it is not a part of the invention, per se. However, by providing the positioning arrangement, a sample 13 mounted on the sample stage 12 can be positioned relative to the chamber and the other portions of the system of the instant invention to perform functions at the respective locations.

The ultraviolet source 14 can be any suitable source such as a laser, a mercury lamp, an ultraviolet source or the like. The focus and scanning optics 15 are provided between the ultraviolet source 14 and the sample stage 12. Typically, the optics arrangement 15 is positioned outside of the chamber 10 in order to preserve a better definition of the frame of reference and so forth. In some embodiments, the focusing device 15 can be mounted within the chamber 10. Alternatively, the chamber 10 can be large enough to accomodate the ultraviolet source 14 and the optics 15.

An ultraviolet transmitting window 16 is provided in one wall of vacuum chamber 10 in order to permit the ultraviolet beam 14A to pass therethrough when the source and focusing apparatus are disposed outside of the chamber. In any event, the ultraviolet beam which is supplied by the components of the instant system are arranged to produce a focused ultraviolet light beam which is capable of being focused to a resolution on the order of microns or sub-microns, as the case may be. If it is possible to accomplish the focusing directly at the source 14, the focusing equipment 15 may be dispensed with.

A collector electrode 17 is positioned within chamber 10. The electrode 17 is positioned so that it does not interfere with the application of the ultraviolet beam to the sample 13. On the other hand, any electrons emitted from the sample 13 as a result of the impingement thereon by the ultraviolet light beam 14A are collected at the collector electrode 17.

A grid 18 is interposed between the sample 15 and the collector electrode 17. The grid 18 is arranged to receive a bias voltage thereon which controls the number and type of electrons which are detected at the electrode 17. The appropriate voltage differences between the electrode 17, the grid 18 and the sample 13 are provided by the electronic module 19, which also performs sensing, nulling, voltage read out, as well as supplying the biasing voltages and the like.

In an alternative arrangement, it should be understood that the UV beam supplied by the UV source and related objects may be scanned over the sample either in addition to or instead of the selective positioning of the sample 13 and sample stage 12.

It is desirable that the vacuum chamber 10 incorporate an environment which permits electrons to travel readily from the sample 13 to the detector electrode 17. As noted, the environment can be a vacuum of approximately 1.0 millitorr or less. Of course, chamber 10 may be selectively vented to atmosphere in order to allow sample interchanges and so forth.

Very briefly, the sample 13 is placed into the chamber 10 on the sample stage 12. A suitable environment is established in the chamber to permit electrons to easily travel to the electron detector 17. The ultraviolet source 14 is activated and the ultraviolet (UV) light beam 14A is focused onto the sample 13. The sample is formed of a known element and, therefore, has a known "work function". The detector electrode 17 is placed in the chamber 10 in the vicinity of the sample and in a position to permit electrons to be easily detected thereby. The electrons are released from the sample 13 in response to the application of the focused UV beam 14A thereon.

Referring now to FIG. 2, there is provided a more detailed schematic showing of the arrangement of the sample (or target) plate 13, the grid 18, and the collector plate 17, sometimes referred to as detector electrode 17. It should be noted that grid 18 is not required in all applications but does permit a greater efficiency in the collection of electrons.

In this instance, the target plate or sample plate 13 is shown connected to ground in order to establish a suitable reference. The grid 18, which can be formed of any suitable metallic material, is energized to establish an electrostatic potential thereat. In this instance, a potential of +300 volts is applied to grid 18. In the embodiments which use a grid, the grid 18 is disposed separate from target plate 13 as determined by the practical size considerations of the apparatus. That is, the distance between the sample 13 and grid 18 is not critical inasmuch as the energy gained by electrons is the same for a given potential, independent of distance. However for practical reasons, e.g. collection efficiency, the grid and collector plates should be as close as possible and practical. As noted above, the grid 18 may be omitted if the collector plate 17 can be placed close enough to the target 13. The collector plate 17 is disposed adjacent to, but separated from, grid 18 by a distance determined by the same considerations discussed above.

The collector plate 17 is connected to a suitable source comprising, for example, a voltage divider network which includes a variable resistor 20 connected between appropriate sources +V and −V. A suitable meter such as ammeter 21 is connected between collector plate 17 and the variable tap of resistor 20 to measure the current produced in this circuit path. The UV beam 14A having a wavelength is directed onto target plate 13 in accordance with the arrangements shown and suggested in FIG. 1.

In operation, the system is first adjusted to apply to the grid 18 a potential, in this case, +300 volts relative to the target plate 13 which is, by definition, grounded. In like fashion, the collector plate 17 is defined to have applied thereto a potential of −300 volts relative to the grid 18. The potential difference between the grid 18 and target plate 13 includes the work function potential value defined as $+V_{WF}$. In like fashion, the potential difference between the collector plate 17 and the grid 18 includes the inverse of the work function, viz., $-V_{WF}$. The adjustable resistor 20 is, initially, adjusted to null the current in the system which is detected by ammeter 21.

That is, in this invention, the material at the target plate is considered to be known, as is the work function for that material. For example, in the typical case of an integrated circuit, a conductor layer is known to be aluminum (for example) and the work function for aluminum is known to be 2.7 to 3.0 eV. Thus, the appropriate adjustments are made to the voltage or potential levels at the collector plate 17 and the grid 18.

Thus, if a value is detected at the ammeter 21, in response to the application of the UV signal at the target, the voltage can be adjusted or changed at the detector electrode 17 until the ammeter reading is, again, null. With this operation, the change in the repelling voltage at detector electrode 17 can be determined.

This measurement technique is, therefore, quantitative and is based upon quantum mechanics, as compared to analog methods used in other prior art systems such as the SEM.

This technique can be used to measure voltages, changes of voltages, timing, detect faults in a circuit or the like. By analyzing the pattern of the voltage differential obtained by various measurements, various analytic information can be determined about the circuit such as, correct D.C. voltage levels, digital logic patterns, rise and fall times, delay times and the like.

In another description, the principal of operation herein is described in terms of the particle level of the basic mechanism and explains the quantitative nature of the voltage measurement. The previous descriptions were directed to the cumulative effect of all of the individual particle interactions summed together. These explanations describe the same thing, viz. voltage measurement by measuring the energy of electrons leaving the conductor or photo-electrons uses the photo-electric effect which is based upon quantum mechanics. It should be understood that the circuit arrangement of FIG. 2 depicts the condition wherein the wavelength of the UV source substantially matches the work function of the target material. Of course, this will not normally be the case. Rather, the more general case is that the UV source has more energy than the work function of the target. Thus, electrons leave the target surface with this extra energy.

The equation for the photo-electric effect is:

$$hV = T_{MAX} + V_o$$

where:
h = Planck's constant
$T_{MAX}$ = maximum energy of electrons leaving the metal
V = frequency of the UV source
$V_o$ = threshold frequency of electrons (work function)

or:

Maximum energy = UV energy − work function energy:

That is, the interaction between the photons (UV light) and the electrons (in the conductor) occur in fixed, incremental steps. Each photon of the light beam transfers a fixed amount of energy to a single electron with which it interacts in the conductor. The known work function of the metal represents the minimum amount of energy that an electron must have to reach and escape from the metal surface. Knowing the above energy factors, permits measurement of the energy of the electrons leaving a metal of known work function when illuminated by a known wave length of light. The measurement of this electron energy indicates the voltage on the conductor relative to a bias on the electron collector plate. The new null voltage which is obtained as noted above, thus, reflects the change in conductor voltage and is, therefore, a measurement of the voltage on the conductor.

Referring now to FIG. 3, there is shown another embodiment of the circuitry used with the instant invention. In this embodiment, the target or sample 13 upon which the UV beam 14A impinges and from which electrons (e−) are dislodged, comprises a sample I.C. with metal conductors thereon. The sample 13 is connected to a suitable reference source which includes a variable resistor 310 connected across a battery 311 with one common terminal connected to system ground. Thus, the voltage supplied from the tap on resistor 310 will vary between ground and −V where V is the voltage across the battery and is related to the work function of the sample. In particular, the battery 311 and resistor 310 are connected to the target 13 and used to calibrate the system. A more typical example is when the target is a circuit such as an integrated circuit surface. A power supply 350 is connected to bias the circuit to its normal operating conditions. This power supply replaces the battery (or vice versa) with a reference point (the minus terminal in this case) connected to system ground. The many conductor interconnections on the I.C. surface are at various voltages relative to system ground and in response to the UV light beam produce photo electrons of varying proportional energy which are measured at collector 17.

In like manner, the collector plate 17 is connected to the current amplifier circuitry. In particular, the collector is connected via resistor 303 to the minus (−) input terminal of operational amplifier 300 which is also connected to the output terminal of amplifier 300 via feedback resistor 307.

The collector plate 17 is further connected via resistors 304 and 305 to the plus (+) terminal of operational amplifier 300. The variable resistor 304 is considered to be the "sense" resistor through which the current from collector 17 is sensed and detected. Resistors 303, 305, 306 and 307 are used to configure the operational amplifier 300 as a differential amplifier. The current sensing resistor 304 can be changed to vary the sensitivity of the circuit. The common node of sense resistor 304 and resistor 305 can be connected to reference sources. For example, batteries 308 and 309 can be used to provide reference voltage levels, if desired.

Resistor 305 and resistor 306 are selected to provide the same bias current to the plus (+) input of amplifier 300 as resistors 303 and 307 supply to the minus (−) input terminal of amplifier 300. This arrangement minimizes the output offset voltages and differential errors. At the critical measurement point, all input nodes (as well as the output node) are at the same potential.

The reference voltage $V_R$ is produced at the output of amplifier 301 by either the auto null circuit 302 or the manual reference voltage source 313. Voltage $V_R$ is supplied to the plus (+) input of operational amplifier 300 through resistor 306 and to the minus (−) terminal of amplifier 301. The minus (−) terminal of amplifier 301 is also connected to the output terminal thereof via a feedback network. Thus, amplifier 301 is a linear buffer, voltage follower with a low impedance output to provide enough current to amplifier 300 and all other circuitry connected to $V_R$.

The plus (+) terminal of buffer 301 is connected to the blade terminal of switch 312 which is used to selectively place the system in the automatic or the manual mode of operation.

In the manual operation, switch 312 is connected to the tap of variable resistor 313 which has the opposite ends thereof connected to the terminals of batteries 314 and 315 which are connected in head-to-tail series. Thus, the cathode of battery 315 is connected to one end of resistor 313 to provide a signal $-V_2$. On the other hand, the anode of battery 314 is connected to the other terminal of resistor 313 to produce a voltage $+V_2$. The common junction of the cathode of battery 314 and the anode of battery 315 is connected to system ground. In this arrangement, the variable resistor 313 can be manually adjusted to supply the reference potential to the plus (+) terminal of buffer amplifier 301 to establish the null output, as described above. In the automatic mode of operation, switch 312 is connected to the automatic null circuit 302 which, basically, comprises the circuit shown in FIG. 4. In particular, the output of the D/A converter 414 (see infra) is connected to switch 312.

In the automatic operation, the auto null circuit (shown in detail in FIG. 4) provides the reference signal to the plus (+) terminal of comparator 301 and the operation continues as described above.

Figure 4:
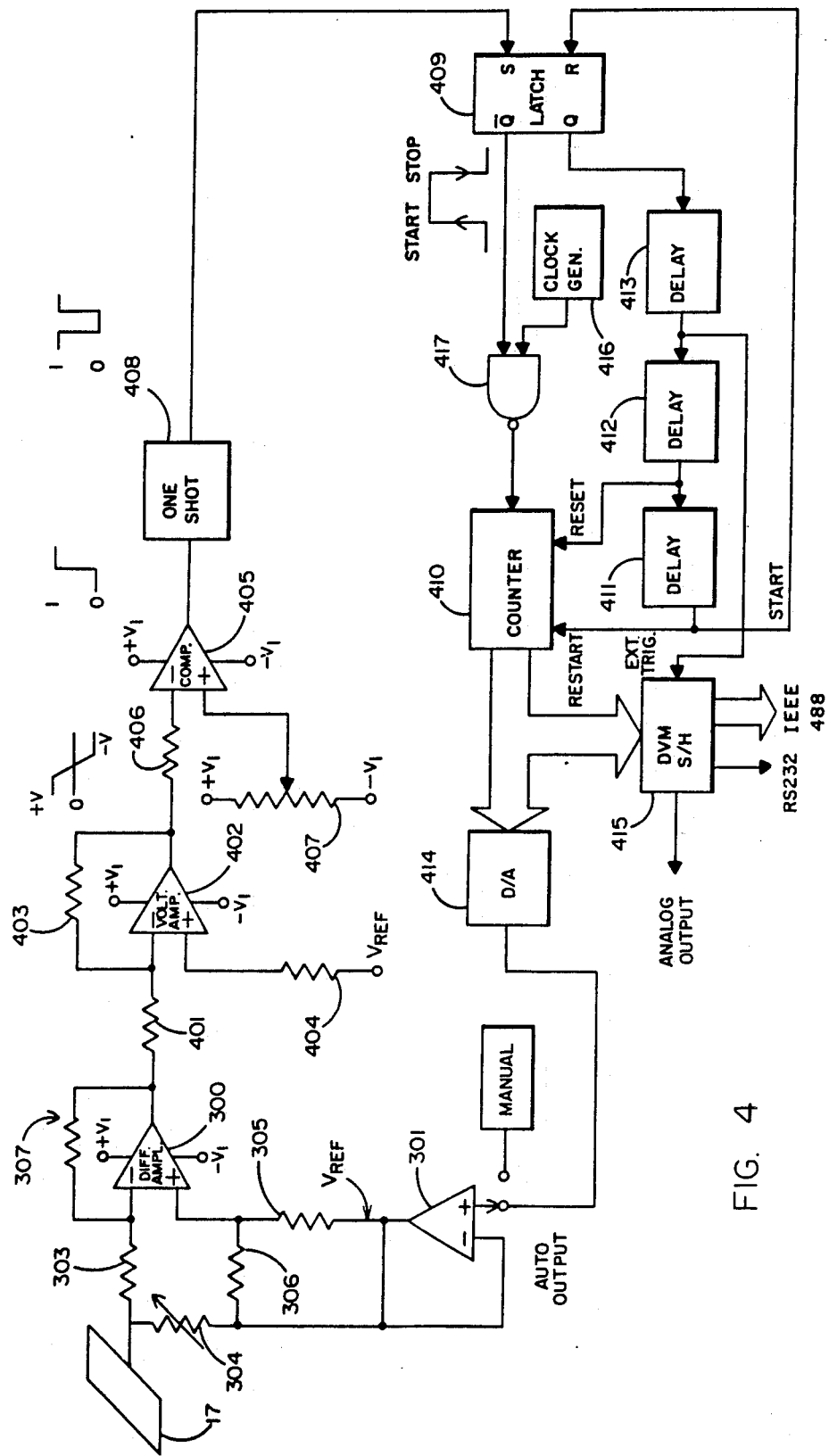
FIG. 4 is a schematic representation of the automatic null portion of the circuitry associated with the system of the instant invention.

Referring now to FIG. 4, there is shown a partially-schematic, partially-block diagram of one embodiment of the measuring circuit for the instant invention. In this embodiment, collector plate 17 is connected to an operational amplifier 405 which can be a comparator network. The connection is made via differential amplifier 300 (see FIG. 3) and inverting voltage amplifier 402. A feedback loop comprising resistor 403 connects the output of voltage amplifier 402 to the minus (−) or inverting input thereof. The plus (+) or non-inverting input of amplifier 402 is connected to a reference potential, $V_{REF}$, by means of resistor 404. The non-inverting input of differential amplifier 300 is connected to the output of buffer 301. The non-inverting input of buffer 301 is connected to the output of digital-to-analog converter 414.

The output of voltage amplifier 402 is supplied by resistor 406 to the minus (−) input of comparator 405. The plus (+) input of amplifier 405 is connected to the tap of a variable resistor 407 which is connected between +V and −V and is adjusted to zero the system or to adjust to a known sample voltage. This sample voltage compensates for the work function of the conductor when it is connected to system ground.

Typically, the output of amplifier 402 is a ramp signal which varies between +V and −V in accordance with the potential at the output of amplifier 300. Conversely, the comparator 405 provides a step output function which is determined by the relationship between the signals at the minus (−) and plus (+) input terminals. This step output function is a 0 when the input level at the minus (−) terminal is less than the reference voltage supplied at the plus (+) input. Conversely, the output is a 1 when the input signal conditions are reversed.

The output of comparator 405 is supplied to the input of one-shot multivibrator 408 which is conventional in configuration. The one-shot 408 produces a narrow pulse when the step function from the comparator 405 switches from 0 to 1.

The output of the one-shot 408 is connected to an input of latch 409. The latch 409 is of any typical construction such as an S/R flip flop. One output of latch 409 is supplied to one input of NAND gate 417. Another input of NAND gate 417 is connected to receive an oscillator signal from clock generator 416. The output of NAND gate 417 is connected to the clock terminal of counter 410. The other output of latch 409 is supplied to an input of a delay line system which comprises separate delay elements 411, 412 and 413. Of course, these elements can be combined as a single delay line with several taps thereon. The output of the delay 411 is supplied to the Start terminal of counter 410. The junction between delay elements 411 and 412 is connected to the Reset terminal of counter 410. The junction of delay elements 412 and 413 is connected to the external trigger of the digital voltmeter 415. The input of delay element 413 is connected to the Q output terminal of latch 409 as noted above. The output of delay element 411 is also connected to the reset terminal R of latch 409. The output signals from counter 410 are supplied to the D/A converter 414 noted above and to the input terminals of the DVM 415.

The DVM 415 provides an analog output which is an optional, auxiliary analog output. This signal provides an analog signal to CRT Z-axis for area mapping potential images and the like. In addition, the output of the DVM is supplied on an RS232 bus which is adapted to be connected to other computer systems, modems or the like. Likewise, the DVM 415 supplies a plurality of output signals on the IEEE 488 bus which is used for image storage, comparison, subtraction, enhancement and other desirable functions.

Thus, in operation, the potential at the collector plate 17 is detected and observed by means of amplifier 300. This potential is compared to the potential supplied from D/A converter 414 via amplifier 301 as described hereinafter. As the voltage at the collector plate 17 varies relative to the reference voltage supplied across resistor 304 (see also FIG. 3), the output from amplifier 402 varies in a ramp-like function. The output may rise or fall depending upon the relationship of the input voltages. When the voltage applied to the minus (−) terminal of comparator 405 reaches a level determined by the adjustment resistor 407, the amplifier 405 produces a step-like function which, in turn triggers one shot 408 to produce a pulse (in this case a negative-going pulse). The pulse is supplied to latch 409 which is placed in the Set condition which produce a Q signal to disable NAND gate 417 so that the clock signals are no longer supplied counter 410. The one-shot signal also produce the Q signal at latch 409 which passes through the delay elements 413, 412 and 411. Initially, this operation applies an external trigger (sample and hold signal) to the DVM 415 from delay circuit 411. The digital volt meter is the output of the system. When the null is reached at the output of amplifier 300, the signal conditions are produced as noted above whereupon the latch 409 flips and signals the DVM to hold the present reading on the DVM. That reading is the voltage on the conductor where illuminated by the UV source. The original pulse from latch 409 then resets the counter 410 after passing through delay element 412 which has provided sufficient delay time for the sample and hold function of the DVM to be concluded. Subsequently, the signal passes through delay element 411 and restarts the counter 410 and, concurrently, resets the latch 409. Thus, the entire measurement cycle is thereby re-initialized.

That is, when the signal passes through delay element 412, a Reset signal is supplied to counter 410 which is reset to a particular count condition, for example 0. The signal continues to pass through delay element 411 and is, ultimately, supplied to counter 410 as a Re-start signal which re-initiates the counting operation thereof. At the same time, the Re-start signal is supplied to latch 409 to reset this circuit to provide the enable signal from the NAND gate 417. Thus, it is seen that the counter 410, is running during the ramp down of amplifier 402 but is disabled by the pulse from one-shot 408.

The counter 410 then stops counting and produces digital signals which are supplied to the D/A converter 414 and to the DVM 415. The D/A converter 414 converts the digital count signal from counter 410 to an analog voltage which is supplied to comparator 301 for the reasons noted above.

The output signals from DVM 415 are then supplied for visual display to an observer, or are supplied as data via the buses to computer or memory.

Figure 5:
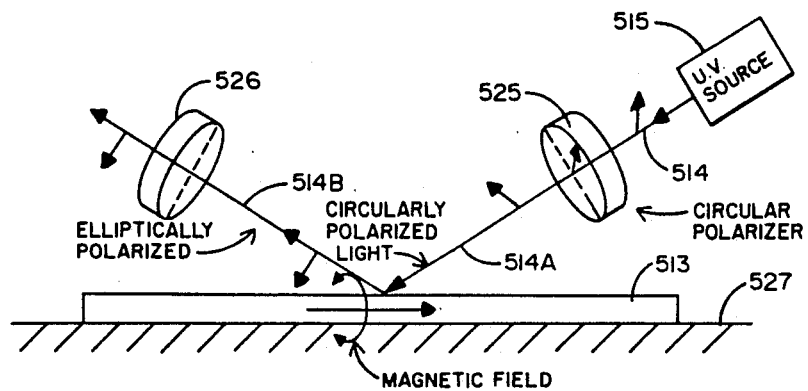
FIG. 5 is a schematic representation of the current measurement and imaging applications of the invention.

Referring now to FIG. 5, there is shown another embodiment of the invention wherein the ultraviolet light source applies a UV beam to the sample or target to produce current measurement and imaging. That is, the circuit devices shown and described previously are primarily used for voltage measuring at the target. This embodiment is capable of measuring and imaging current in the target conductor.

In this embodiment the UV source 515 provides a linearly polarized UV beam 514. The source 515 comprises a suitable source and any appropriate optics and focusing equipment such as items 14 and 15 shown in FIG. 1. The linearly polarized beam 514 is passed through a circular polarizer apparatus 525 which converts the linearly polarized signal to a circularly polarized light beam 514A (which corresponds to the beam 14A shown in FIG. 1). The beam 514A impinges upon the target conductor 513 and is reflected thereby as an elliptically polarized UV beam 514B. This latter beam is supplied to the analyzer 526 which can be a circular polarizer that analyzes the polarization angle of rotation of beam 514B relative to the orientation of beam 514A.

The conductor 513 may be considered to be a portion of an integrated circuit formed on the surface of a chip or substrate 527 which can be of any suitable material such as silicon or the like.

In the typical application, conductor 513 carries a current I therealong. The conductor is considered to be a long narrow strip of metal as opposed to a plane of metal. Consequently, a current path is established therethrough. The current through the conductor causes a magnetic field B to be generated therearound in accordance with well known laws of physics.

It is also well known, in accordance with the principles of ellipsometry, that the rotation of circularly polarized light is an indication of the thickness and/or the dielectric constant of an insulator. Also, the strength of the magnetic field B which surrounds the conductor through which the current flows is a function of the magnitude of the current in the conductor. This magnetic field operates to rotate the angle of circularly polarized light in accordance with the well known Kerr effect originally discovered for light reflected off the core of an electromagnet. (However, this has not yet been reported for a DC current in a conductor.) Consequently, the measurement of the rotation, in radial degrees, of the circularly polarized beam 514B which is reflected by the current carrying conductor 513, is a measure of the current which exists in that conductor. Thus, the same UV source as described above can be used to measure the voltage or the current in the conductor provided the appropriate sensing devices are utilized.

Figure 6:
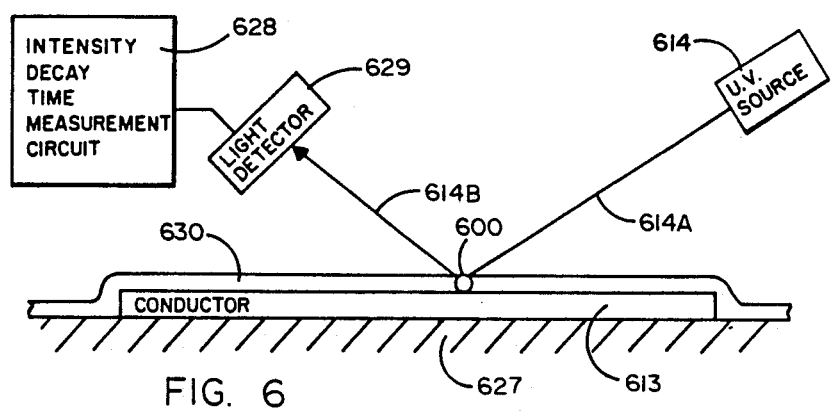
FIG. 6 is a schematic representation of the non-contact temperature measurement application of the invention.

Referring now to FIG. 6, there is shown a method and apparatus for measuring the temperature of the device with a non-contact temperature measuring concept.

In this case, a focused UV source 614 is provided. This source is similar to the source 515 in FIG. 5 except that source 614 is arranged to produce a pulsed beam to permit decay-time measurement. The source provides a beam 614A which has a wavelength appropriate to excite the phosphluorescent or fluorescent coating 630 and impinges upon the surface of a suitable sample that has been coated with a thin layer 630 of fluorescent or phosphluorescent material. A reflected beam 614B is supplied to a light detector 627 which can comprise photo-multiplier tubes, photo-diodes or the like. The light detector 629 supplies a signal to a device 628 consisting of two comparators triggered at a known controllable delay time. Detector 629 is used to measure the intensity decay time for the signal emitted by the phospher on the sample surface and reaching the light detector 627.

In the embodiment shown in FIG. 6, a suitable substrate such as an integrated circuit (IC) device 627 is provided. Typical components such as conductor 613 and other IC components are formed on the surface of substrate 627. These components are, typically, a metal or semiconductor conductor line or pad. A fluorescent material coating 630 is disposed over the surface of substrate 627 and the surface of the circuit elements 613.

In operation, the UV beam 614 is directed against the fluorescent material coating. The fluorescent coating 630 tends to absorb the UV pulsed beam. However, the decay time of the intensity of the light which is given off by the fluorescent materials (when illuminated by the UV source) is a function of the temperature of the flourescent material. The temperature of the fluorescent material 630 is, of course, a function of the temperature of the underlying conductor element 613. Consequently, a measure of the decay time at a selected spot 600 in the fluorescent coating 630 is a measure of the temperature at that spot. Thus, by scanning the sample with the pulsed UV beam 614A (either by moving the source 614 or moving the sample 627) the temperature of the underlying conductor 613 can be detected. This can determine whether the temperature is uniform throughout the sample or if "hot spots" have been developed therein.

Figure 7:
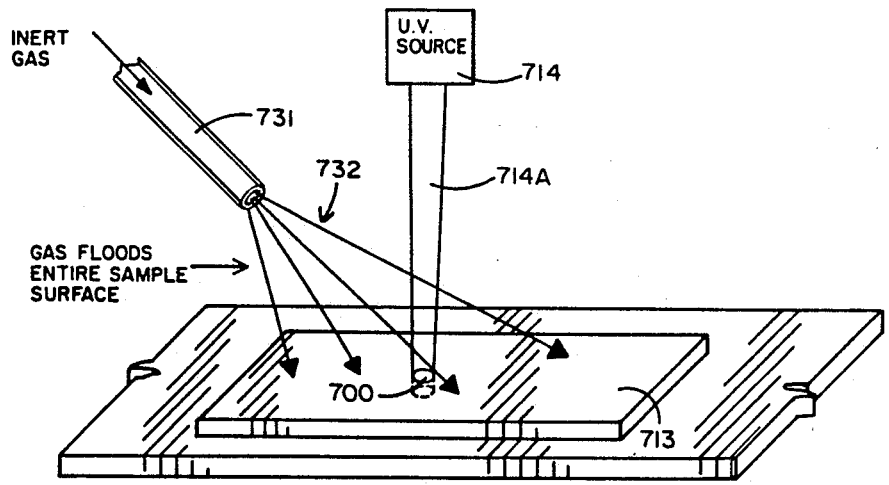
FIG. 7 is a schematic representation of the system of the instant invention when used to remove selective portions of metal layers with a non-contact operation.

Another embodiment of the invention is shown in FIG. 7. This invention utilizes the focused UV light source 714 as a controlled, selective etching or material removing apparatus.

The UV source 714 produces the focused UV beam 714A as before. The substrate 727 is supported on the sampling or target arrangement as before. A layer 713 of any material is disposed on the substrate 727. This layer can be of a conductive material, semiconductive material or insulative material, as may occur. The focused UV beam 714A impinges on the layer 713 in a highly focused, high resolution beam location. In a preferred embodiment, the beam 714A strikes the layer 713 in a perpendicular fashion. This usually permits the smallest resolution spot of the UV beam to impinge upon the layer 713. Of course, if other arrangements are desired, the angle of incidence of the UV light beam can be altered.

In this embodiment, a suitable source 731 of an inert gas is provided. This source can be any suitable source such as a tank of gas or the like. The gas is provided by the source 731 and tends to disperse around the area and to flood the sample 713. In a typical application, the inert gas is $CCl_2F_2$; $CF_4$; $SF_6$ or any similar compound gas.

It has been noted that the illumination of certain compounds, especially gases, with the appropriate wavelength of UV light causes the compound gas to dissociate into the respective elements. Thus, a gas which includes chlorine or fluorine can be dissociated so that the chlorine or fluorine will be free and will chemically attack the surface of the layer 713 at the particular site where the surface is struck by the UV beam. That is the compound gas dissociates at that point, and that point only, whereupon the corrosive gases are released. The other areas of the surface are not attacked inasmuch as the compound gas remains inert where it is not illuminated by the UV light beam.

Figure 8:
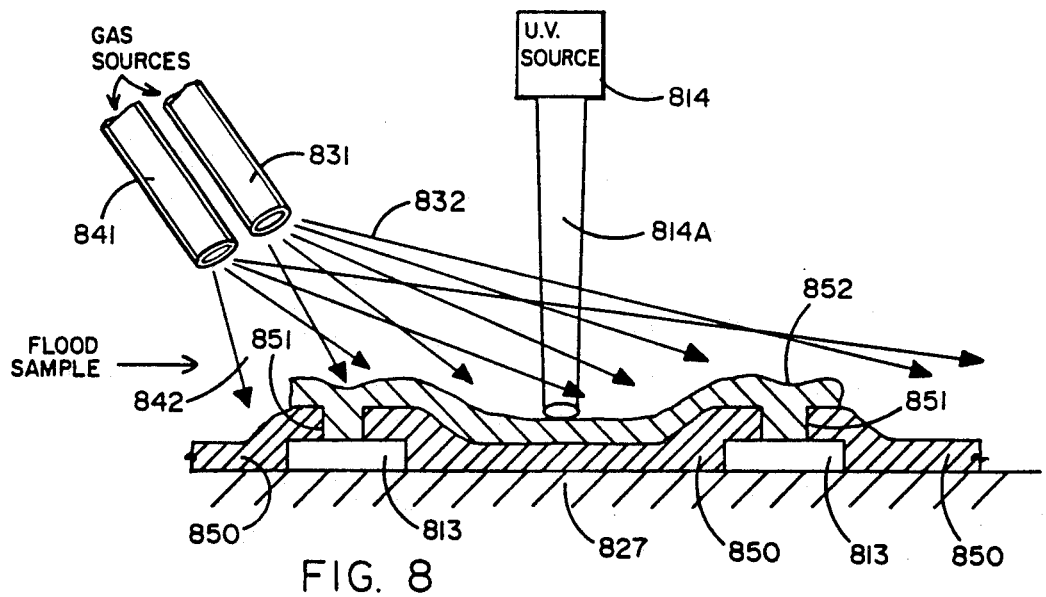
FIG. 8 is a schematic representation of utilization of the system in selectively applying a layer of conductive material to an integrated circuit device in a non-contact operation.

Referrring now to FIG. 8, there is shown another embodiment of the instant invention. In this instance, the source 814 is similar to the source 714 and produces the focused UV beam 814A. The sources 831 and 841 are provided to supply different types of non-reacting gases such as silane and hydrogen which comprise the constituents of polysilicon conductors or layers. The silane gas 832 and the hydrogen gas 842 are dispersed and flooded over the surface of the semiconductor device.

In the embodiment shown, the semiconductor device includes a suitable substrate 827 which may be silicon or the like on which have been deposited (or otherwise formed) conductors 813. Conductors 813 can be one or more metallic conductors, together with an insulator layer 850 which has been formed over the conductors and the surface of the substrate 827. Through-holes 851 have been formed in the insulator layers 850 at prescribed locations, typically, in association with the conductor layers 813. These through-holes 851 can be formed in accordance with the apparatus and operation shown and described in FIG. 7.

In the embodiment shown in FIG. 8, the non-reacting gases silane and hydrogen are, as noted, flooded over the samples, typically at reduced pressure (1 to 10 Torr) in the chamber (such as chamber 10 in FIG. 1). Where the UV light beam is focused on the surface, the gases are caused to combine and form a polysilicon deposit on the surface. Conversely, the gases do not combine and do not form a deposit on the surface in the absence of the UV beam. Consequently, a highly controlled deposition technique of oxides, nitrides and some metals is provided at selective, focused sites to effect a minute alteration of existing devices can be utilized.

Of course, it must be recognized that the UV light source must provide a beam of sufficiently short wavelength (or sufficiently high energy) to cause the catalytic reaction between the gases or to decompose component gases so that they can react together. The energy required is referred to as the "activation energy" of the reaction. In some cases, a portion of the energy can be supplied by heat in the sample, with the remaining critical energy being supplied by the UV source.

In the invention shown and described herein, it is possible to cause a selective deposition of films only where the UV light is focused and scanned in conjunction with the gases. With this apparatus, it is possible to provide the layers precisely where they are desired. Consequently, it is possible to avoid the steps of masking and etching of semiconductor devices required during the actual fabrication process. Thus, high resolution modification or repair of IC's can be effected relatively easily.

Figure 9:
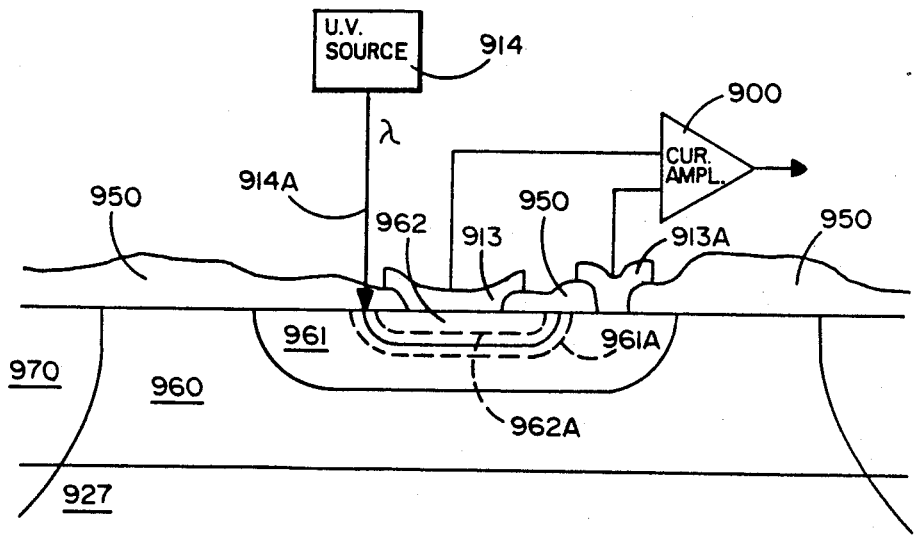
FIG. 9 is a schematic representation of the application of the system when used in junction imaging.

Referring now to FIG. 9, there is shown yet another embodiment of the instant invention wherein a source 914 of a focused UV beam 914A is utilized. This focused beam is directed onto a semiconductor device. A typical cross-sectional view of an integrated circuit device, such as a transistor, is also depicted.

In the embodiment shown, a transistor including a P-type substrate 927 is shown. A collector electrode portion 960 has been formed in the substrate by any suitable technique such as, but not limited to, ion implantation. The P-isolation areas 970 are provided on either side of the collector portion of the transistor to provide the isolation between semiconductor devices on the integrated circuit chip.

The base electrode portion 961 of the transistor device is formed in the collector portion 960, again by any suitable means such as ion implantation, annealing, diffusion or the like. The emitter electrode portion 962 of the device is formed within the base structure. Again, the emitter portion is formed in any suitable fashion.

Insulator layers 950 of oxide such as $SiO_2$ or the like are formed on the surface of the integrated circuit device. The layers 950 are, typically, grown on the surface of the silicon chip and then etched away in any suitable fashion to provide through-holes to reach the respective portions of the semiconductor device which has been formed in the substrate. These connections are made through metal connectors such as conductors 913 or 913A. Typically, these metal conductors are formed of aluminum. In the ultimate construction, other insulating layers may be disposed over the device as shown. However, the transistor cross-section which is shown in FIG. 9 is a typical configuration. Portions of this device may be fabricated in accordance with the techniques common to the semiconductor industry.

In the apparatus shown in FIG. 9, a current amplifier 900 is connected to the metal conductors 913 and 913A to supply a current signal to, inter alia, the Z axis of a cathode ray tube (CRT).

The apparatus shown in FIG. 9 indicates a suitable fashion for deriving an image of a semiconductor junction. That is, when a typical semiconductor material is illuminated by a focused, high energy UV beam, electron-hole pairs are generated within the semiconductor material. If the electron-hole pairs are sufficiently close to the junction of the semiconductor device, i.e. within the space charge or depletion region defined by the dotted lines 961A and 962A, the existing Peltier field across the junction tends to separate the electrons and the holes. In particular, the electrons are drawn into the emitter region and the holes are drawn into the base region. Of course, the emitter region already exhibits an excess of electrons and the base region exhibits an excess of holes. Therefore, these extra charges generated by the UV beam will flow in an external circuit even without a bias supply, provided that a sufficiently low impedance connection is made.

In the embodiment shown, the current amplifier 900 collects, measures and amplifies the elctron-hole pair current which is generated by the UV light beam. When the UV light beam 914A is scanned across the IC device in an X-Y pattern, an image of the junction is created at the CRT by the modulation of the electron beam which illuminates the screen of the CRT. Thus, an image of the junction in question can be attained by a focused UV source and related apparatus which provides another analytical mode of the instrument not previously done with a UV beam for high spacial resolution.

Thus, there have been shown and described specific applications of a focused UV source as a source of a UV light beam which can be used to measure, image, and modify semiconductor devices and the like. Certain specific applications have been shown and described. Other embodiments and modifications thereof may be conveived by those skilled in the art. However, any such modifications which fall within the purview of this description are intended to be included therein. This description is intended to be illustrative only and is not intended to be limitative. Rather, the scope of the application is limited only by the claims appended hereto.

I claim:

1. Apparatus for performing non-contact measurement and alteration of electrical properties of conductors comprising, source means for providing a focused beam of UV light, sample holder means for supporting a sample means to be operated upon by directing said focused beam of light thereon and producing a reflection of at least a portion of said focused beam of light by said sample means, said sample means includes an electrical current carrying portion, said source means and said sample holder means adapted for movement relative to each other, circular polarizer means interposed between said sample means and said source means for circularly polarizing said focused beam of light before it is directed onto said sample means, chamber means wherein said sample holder means is disposed for supporting said sample means for receiving said focused beam, pressure control means for selectively altering the pressure within said chamber means, and output detection means for detecting a characteristic of said sample means supported on said sample holder means as determined by directing said focused beam of light thereon, said output detection means includes circular polarizer analyzer means for detecting the angle of rotation of said focused beam of UV light after reflection from said sample means, said angle of rotation is a function of the magnetic field generated around said electrical current carrying portion of said sample means which magnetic field is a function of the magnitude of the current in said current carrying portion of said sample means.

2. The apparatus recited in claim 1 wherein,
said sample means includes an insulator portion,
said angle of rotation is a function of at least one of the thickness and dielectric constant of said insulator portion of said sample means.

3. The apparatus recited in claim 1 wherein,
said sample means includes a fluorescent coating disposed over a conductive element on the surface of said sample means,
said source means is operative to produce a pulsed, focused beam of UV light,
said output detection means includes,
light detector means for receiving said focused beam reflected off said fluorescent coating, and
intensity decay detecting means connected to said light detector means for detecting the time of decay of the light received at said light detector means.

4. The apparatus recited in claim 1 wherein,
said sample means includes a semiconductor device therein which is comprised of semiconductor material wherein electron-hole pairs are generated as a result of receiving said light beam thereon such that an electrical current is supplied to said output detection means.

5. The apparatus recited in claim 1 wherein,
said focused beam of light is directed upon said sample means in a non-perpendicular direction.

6. The apparatus recited in claim 1 wherein, said output detection means indicates an electrical current flowing in said sample means, 7. The apparatus recited in claim 1 wherein, said focused beam of UV light produced by said source means is linearly polarized.

8. The apparatus recited in claim 1 wherein, said focused beam of light is elliptically polarized after reflection by said sample means.

9. The apparatus recited in claim 1 wherein, said sample means comprise as integrated circuit means, and said electrical current carrying portion comprises an electrical conductor formed on said integrated circuit means.

10. The apparatus recited in claim 3 wherein, said intensity decay detecting means provides an indication of the temperature of the portion of the sample means upon which said focused beam of light impinges.

11. The apparatus recited in claim 1 wherein, said output detection means includes a collector plate for collecting electrons which have been released by said sample means in response to the focused beam impinging thereon.

12. The apparatus recited in claim 11 including, repelling means disposed between said sample means and said collector plate for providing an electric field which diverts said electrons released by said sample means away from said collector plate.

13. The apparatus recited in claim 12 including, potential supply means for controlling the electric potentials between said sample means and said repelling means, and between said repelling means and said collector plate.

14. The apparatus recited in claim 11 including, null adjusting means for establishing a null condition relative to said collector plate so that an active condition at said collector plate can be detected wherein said active condition is representative of the energy of electrons collected at said collector plate.

15. The apparatus recited in claim 1 wherein, said pressure control means includes vacuum pump means connected to said chamber means to produce at least a partial vacuum in said chamber means.

16. The apparatus recited in claim 1 including, scanning means for moving said focused beam relative to said sample means thereby to scan said focused beam over said sample means.

17. The apparatus recited in claim 1 wherein, said source means is disposed external to said chamber means.

18. The apparatus recited in claim 12 wherein, said repelling means comprises grid means interposed in the path of electrons which move between said sample means and said collector plate.

19. The apparatus recited in claim 1 wherein, said focused beam of UV light is directed upon said sample means in a non-perpendicular direction.

20. The apparatus recited in claim 14 wherein, said null adjusting means includes an automatic null circuit and a manual null circuit.

21. Apparatus for performing non-contact measurement and alteration of electrical properties of conductors comprising, source means for providing a focused beam of UV light, sample holder means for supporting a sample means to be operated upon by directing said focused beam of light thereon and producing a reflection of at least a portion of said focused beam of light by said sample means, said source means and said sample holder means adapted for movement relative to each other, circular polarizer means interposed between said sample means and said source means for circularly polarizing said focused beam of light before it is directed onto said sample means, chamber means wherein said sample holder means is disposed for supporting said sample means for receiving said focused beam, pressure control means for selectively altering the pressure within said chamber means, output detection means for detecting a characteristic of said sample means supported on said sample holder means as determined by directing said focused beam of light thereon, said output detection means includes circular polarizer analyzer means for detecting the angle of rotation of said focused beam of UV light after reflection from said sample means, and gas source means for supplying a compound non-reactive gas to said sample means such that said compound gas is broken into its constituents components by said focused beam of UV light whereupon selected portions of said sample means are attacked by the constituent components of the gas but not by the non-reactive compound gas.

22. Apparatus for performing non-contact measurement and alteration of electrical properties of conductors comprising, source means for providing a focused beam of UV light, sample holder means for supporting a sample means to be operated upon by directing said focused beam of light thereon and producing a reflection of at least a portion of said focused beam of light by said sample means, said source means and said sample holder means adapted for movement relative to each other, circular polarizer means interposed between said sample means and said source means for circularly polarizing said focused beam of light before it is directed onto said sample means, chamber means wherein said sample holder means is disposed for supporting said sample means for receiving said focused beam, pressure control means for selectively altering the pressure within said chamber means, output detection means for detecting a characteristic of said sample means supported on said sample holder means as determined by directing said focused beam of light thereon, said output detection means includes circular polarizer analyzer means for detecting the angle of rotation of said focused beam of UV light after reflection from said sample means, and a plurality of gas sources for supplying a plurality of non-reacting gases to said sample means such that said plurality of gases are caused to combine and react with said sample means only in the locations where the focused beam of UV light impinges upon said sample means.

* * * * *